United States Patent [19]

Zhang et al.

[11] Patent Number: 5,559,476
[45] Date of Patent: Sep. 24, 1996

[54] VOLTAGE CONTROLLED OSCILLATOR INCLUDING VOLTAGE CONTROLLED DELAY CIRCUIT WITH POWER SUPPLY NOISE ISOLATION

[75] Inventors: Zhongxuan Zhang, Fremont; He Du, Campbell, both of Calif.

[73] Assignee: Cirrus Logic, Inc., Fremont, Calif.

[21] Appl. No.: 455,311

[22] Filed: May 31, 1995

[51] Int. Cl.$^6$ .................................................. H03B 5/02
[52] U.S. Cl. ........................... 331/57; 331/34; 331/177 R; 327/278; 327/280; 327/281
[58] Field of Search ............................ 331/57, 177 R, 331/34; 327/278, 280, 281

[56] References Cited

U.S. PATENT DOCUMENTS

| 4,710,726 | 12/1987 | Czarnul | 327/336 |
| 4,988,960 | 1/1991 | Tomisawa | 331/57 |
| 5,272,453 | 12/1993 | Traynor et al. | 331/57 |
| 5,298,870 | 3/1994 | Cytera et al. | 331/57 |

FOREIGN PATENT DOCUMENTS

| 0481093 | 4/1992 | European Pat. Off. | 327/281 |

OTHER PUBLICATIONS

Young et al., "A PLL Clock Generator with 5 to 110 Mhz of Lock Range for Microprocessors," *IEEE Journal of Solid-State Circuits*, vol. 27, No. 11, (Nov. 1992) pp. 1599–1607.

*Primary Examiner*—Siegfried H. Grimm
*Attorney, Agent, or Firm*—Majestic, Parsons, Siebert & Hsue

[57] ABSTRACT

A VCO includes a ring oscillator formed by connecting a plurality of voltage controlled inverting delay cells together, and a plurality of transistors for providing control voltages to the plurality of voltage controlled inverting delay cells. Preferably, each transistor has a drain connected to a reference voltage, and a source connected to a voltage controlled inverting delay cell paired to that transistor. Consequently, each transistor acts as a source-follower so that it provides a control voltage to its corresponding voltage controlled inverting delay cell which follows a control voltage driving its gate, thereby isolating the control voltage provided to its corresponding voltage controlled inverting delay cell from power supply noise.

23 Claims, 9 Drawing Sheets fig.1
prior art fig. 2 fig. 3a fig.3b fig.3c fig.3d fig.3e fig.4a fig.4b

VOLTAGE CONTROLLED OSCILLATOR INCLUDING VOLTAGE CONTROLLED DELAY CIRCUIT WITH POWER SUPPLY NOISE ISOLATION

BACKGROUND OF THE INVENTION

This invention relates in general to voltage controlled oscillators and in particular, to voltage controlled oscillators including one or more voltage controlled delay circuits with power supply noise isolation.

Power supply noise may be a significant problem in mixed-mode circuits including both digital and analog circuitry on the same integrated circuit chip. In such mixed-mode circuits, noise induced on a power supply line by the switching of the digital circuitry may cause the analog circuitry connected to the power supply line to perform poorly or inaccurately. The performance of certain analog circuitry such as voltage controlled delay elements and voltage controlled oscillators including a ring oscillator formed of such voltage controlled delay elements are particularly sensitive to such noise.

Figure 1:
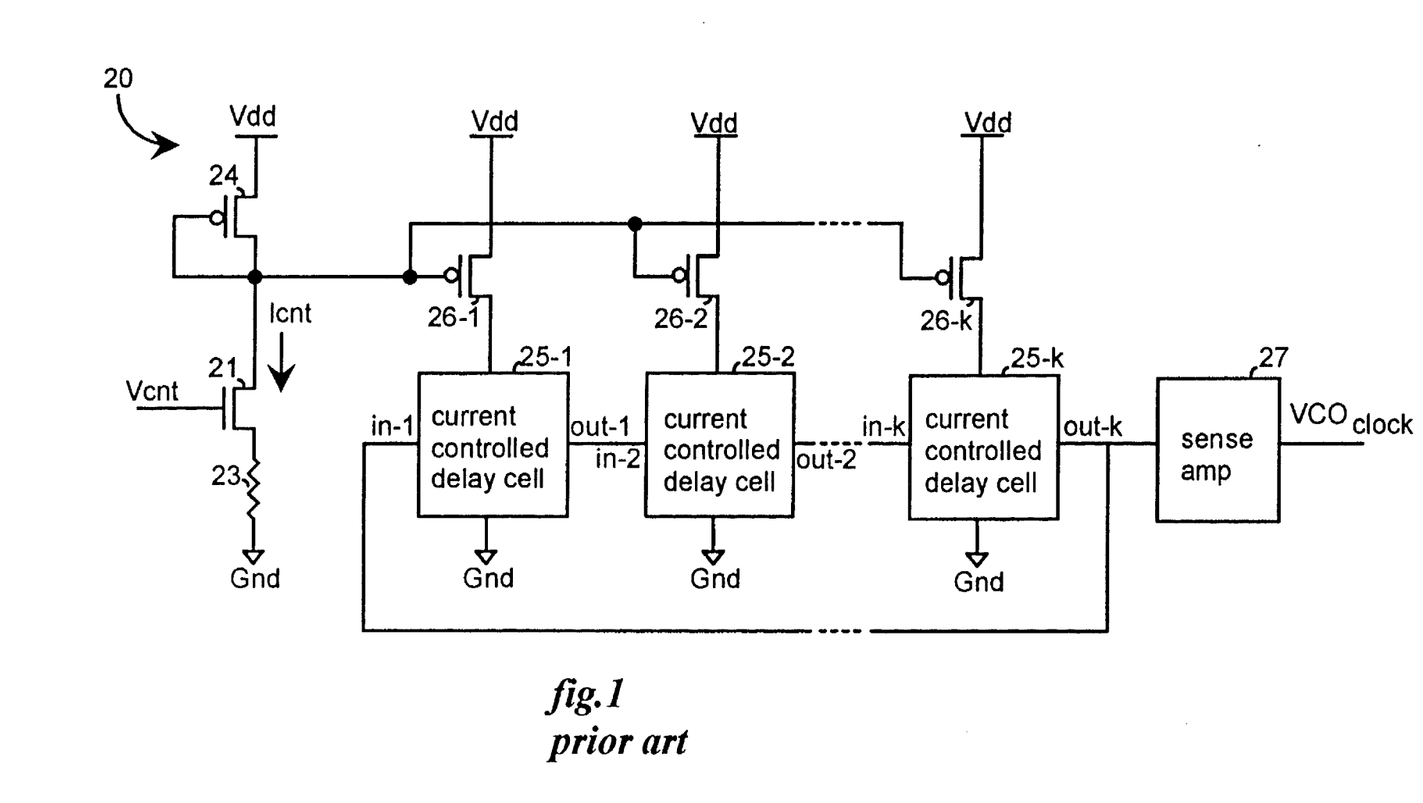
FIG. 1 illustrates, as an example, a block diagram of a prior art VCO.

FIG. 1 illustrates, as an example, a prior art voltage controlled oscillator ("VCO") 20. Included in the VCO 20 are a plurality of current controlled delay cells, 25-1 to 25-k, connected together to form a k-stage ring oscillator, wherein an input of each current controlled delay cell (or stage) in the ring oscillator is connected to an output of another current controlled delay cell in the ring oscillator. For example, an input in-2 of a second current controlled delay cell 25-2 is shown connected to an output out-1 of a first current controlled delay cell 25-1 in the ring oscillator, and as another example, an input in-1 of the first current controlled delay cell 25-1 is shown connected to an output out-k of a last current controlled delay cell 25-k in the ring oscillator.

Also included in the VCO 20 is a p-mos transistor 24, an n-mos transistor 21, and a resistor 23 connected together to form a controllable current sink, and a plurality of p-mos transistors, 26-1 to 26-k, individually connected to the p-mos transistor 24 to form a plurality of current mirrors. The p-mos transistor 24 is a diode-connected transistor having its source connected to a high voltage end Vdd of a power supply, and its gate and drain connected together. The n-mos transistor 21 acts as a control transistor having its source connected through the resistor 23 to a ground reference Gnd, and its drain connected through the diode-connected p-mos transistor 24 to the high voltage end Vdd of the power supply, such that a control voltage Vcnt applied to the gate of the n-mos transistor 21 controls a current Icnt flowing through the diode-connected p-mos transistor 24, the n-mos transistor 21, and the resistor 23. The sources of each of the p-mos transistors, 26-1 to 26-k, is connected to the supply voltage Vdd, and the gates of each of the p-mos transistors, 26-1 to 26-k, is connected to the gate of the p-mos transistor 24, such that a current flowing through each of the plurality of p-mos transistors, 26-1 to 26-k, mirrors the control current Icnt. Accordingly, the control voltage Vcnt applied to the gate of the n-mos transistor 21 controls the period of oscillation of the VCO 20 by controlling the current flowing into each of the current controlled delay cells, 25-1 to 25-k, which in turn, controls the delay of each of the current controlled delay cells, 25-1 to 25-k, which in turn, determines the period of oscillation of the VCO 20.

One problem with the prior art VCO 20, however, is that noise on a power supply line connected to the high voltage end Vdd of the power supply is readily transmitted through the plurality of p-mos transistors, 26-1 to 26-k, and as a consequence, readily transmitted as current fluctuations flowing into the plurality of current controlled delay cells, 25-1 to 25-k. This results in the period of oscillation of the VCO 20 inadvertently fluctuating from its intended controlled state.

OBJECTS AND SUMMARY OF THE INVENTION

Accordingly, one object of the present invention is a VCO which is less sensitive than prior art VCOs to power supply noise.

Another object of the present invention is a delay circuit useful in a VCO which provides good power supply noise isolation.

Still another object of the present invention is a VCO which is of simple construction and easily manufacturable.

These and additional objects are accomplished by the various aspects of the present invention, wherein briefly stated, one aspect of the present invention is a voltage controlled delay circuit with power supply noise isolation, comprising: delay means responsive to an input voltage for varying the delay of a signal propagating through the delay means; and a transistor having a drain connected to a power supply, a gate connected to a control voltage, and a source providing the input voltage to the delay means such that the input voltage follows the control voltage and is isolated from noise on the power supply connection to the transistor.

Another aspect of the present invention is a voltage controlled delay circuit included in a voltage controlled oscillator, wherein the voltage controlled delay circuit comprises: delay means responsive to an input voltage for varying the delay of a pair of signals propagating through the delay means; and a transistor having a drain connected to a power supply, a gate connected to a control voltage, and a source providing the input voltage to the delay means such that the input voltage follows the control voltage and is isolated from noise on the power supply connection to the transistor.

Still another aspect of the present invention is a voltage controlled oscillator with power supply noise isolation comprising a plurality of transistor and voltage controlled delay cell pairs, wherein individual ones of the transistors have a gate connected to a control voltage, a drain connected to a power supply, and a source connected to a voltage controlled delay cell paired to the individual one transistor for providing an input voltage to the voltage controlled delay cell such that the input voltage follows the control voltage and is isolated from noise on the power supply connection to the individual one transistor.

Still another aspect of the invention is a computer system comprising: a host processor; and a peripheral controller including a voltage controlled oscillator having at least one voltage controlled delay circuit with power supply noise isolation, wherein individual ones of the at least one voltage controlled delay circuit comprises a delay means responsive to an input voltage for varying the delay of a signal propagating through the delay means, and a transistor having a drain connected to a power supply, a gate connected to a control voltage, and a source providing the input voltage to the delay means such that the input voltage follows the control voltage and is isolated from noise on the power supply connection to the transistor.

Additional objects, features and advantages of the various aspects of the present invention will become apparent from

DETAILED DESCRIPTION OF THE PREFERRED EMBODIMENT

Figure 2:
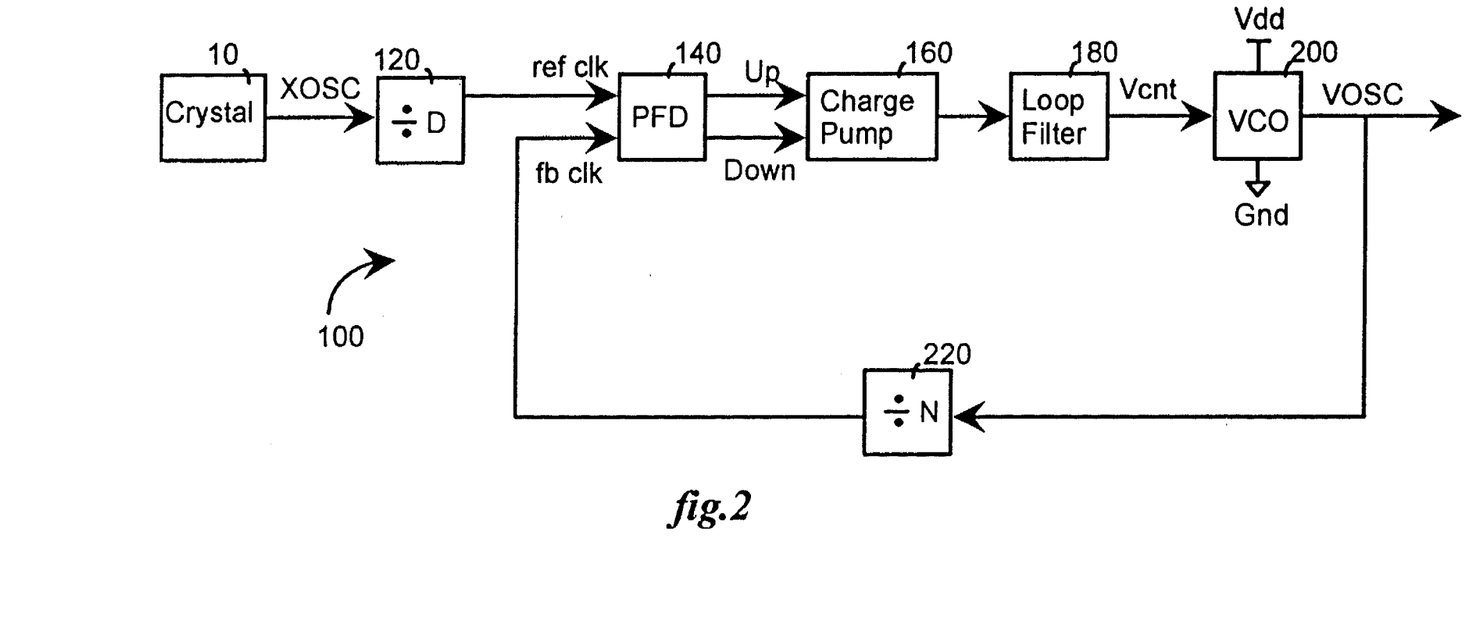
FIG. 2 illustrates, as an example, a block diagram of a PLL including a VCO utilizing aspects of the present invention.

VCOs are particularly useful in phase-locked loop circuits ("PLLs") such as PLL 100 in FIG. 2. The PLL 100 locks the phase of an output clock signal VOSC generated by a VCO 200, to that of an input clock signal XOSC generated by a crystal oscillator circuit 10. In general, it does this by comparing the respective phases of the two clock signals and adjusting a control voltage Vcnt to the VCO 200 accordingly. In particular, a reference signal "ref clk", generated by providing the input clock signal XOSC to a divide-by-D circuit 120, is connected to a first input of a phase/frequency detector ("PFD") 140, and a feedback signal "fb clk", generated by providing the output clock signal VOSC to a divide-by-N circuit 220, is connected to a second input of the PFD 140. Depending upon whether the phase of the feedback signal "fb clk" leads or lags that of the reference signal "ref clk", the PFD 140 activates either an up or down signal to a charge pump circuit 160. The charge pump circuit 160 thereupon generates the control voltage Vcnt by either charging up in response to the up signal being activated by the PFD 140, or discharging down in response to the down signal being activated by the PFD 140. The loop filter 180 is placed in the forward path of the PLL 100 to provide stability.

For additional details on such PLLs, see, e.g., Young, Ian A. et. al., "A PLL Clock Generator with 5 to 110 MHz of Lock Range for Microprocessors," *IEEE Journal of Solid-State Circuits*, vol. 27, No. 11, November 1992, which details are incorporated herein by this reference.

Figure 3A:
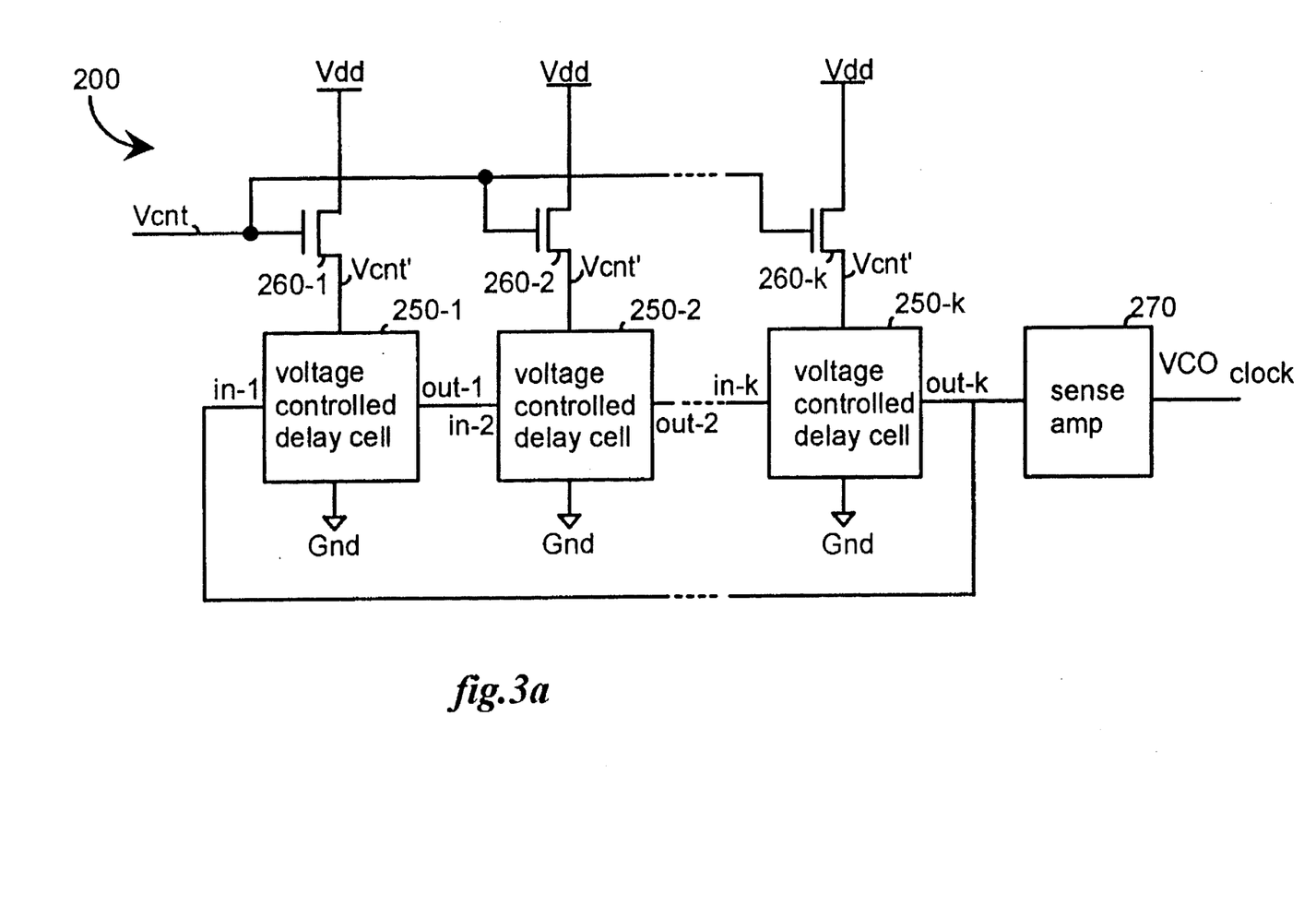
FIG. 3a illustrates, as an example, a block diagram of a VCO useful for the PLL of FIG. 2.

FIG. 3a illustrates, as an example, a block diagram of the VCO 200. The VCO 200 includes an odd number of a plurality of voltage controlled inverting delay cells, 250-1 to 250-k, connected together to form a k-stage ring oscillator, and a plurality of n-mos transistors, 260-1 to 260-k, operating in saturated conducting states and acting as source-followers to provide a control voltage Vcnt' (also referred to herein as an input voltage) to each of the plurality of voltage controlled inverting delay cells, 250-1 to 250-k, while isolating the plurality of voltage controlled inverting delay cells, 250-1 to 250-k, from power supply noise. The drains of the plurality of n-mos transistors, 260-1 to 260-k, are each connected to a high voltage end Vdd of a power supply, the gates of the plurality of n-mos transistors, 260-1 to 260-k, are each connected to the control voltage Vcnt, and the sources of the plurality of n-mos transistors, 260-1 to 260-k, are each connected to a corresponding one of the plurality of voltage controlled inverting delay cells, 250-1 to 250-k.

The k-stage ring oscillator is formed by connecting an output of each one of the plurality of voltage controlled inverting delay cells, 250-1 to 250-k, to an input of another one of the plurality of voltage controlled inverting delay cells, 250-1 to 250-k, in such a fashion that the plurality of voltage controlled inverting delay cells, 250-1 to 250-k, form a ring structure. For example, an output out-1 of a first voltage controlled inverting delay cell 250-1 is connected to an input in-2 of a second voltage controlled inverting delay cell 250-2, and so on, until an output out-k of a kth voltage controlled inverting delay cell 250-k is connected back to an input in-1 of the first voltage controlled inverting delay cell 250-1. Thereupon, by varying the input voltage Vcnt' provided to each of the plurality of voltage controlled inverting delay cells, 250-1 to 250-k, the delays of the plurality of voltage controlled inverting delay cells, 250-1 to 250-k, are correspondingly varied, and as a result, the period of oscillation of the VCO 200 is correspondingly varied (as evidenced, for example, on a signal $VCO_{clock}$ sensed through a sense amplifier 270 generated at the output out-k of the kth voltage controlled inverting delay cell 250-k).

Figure 3B:
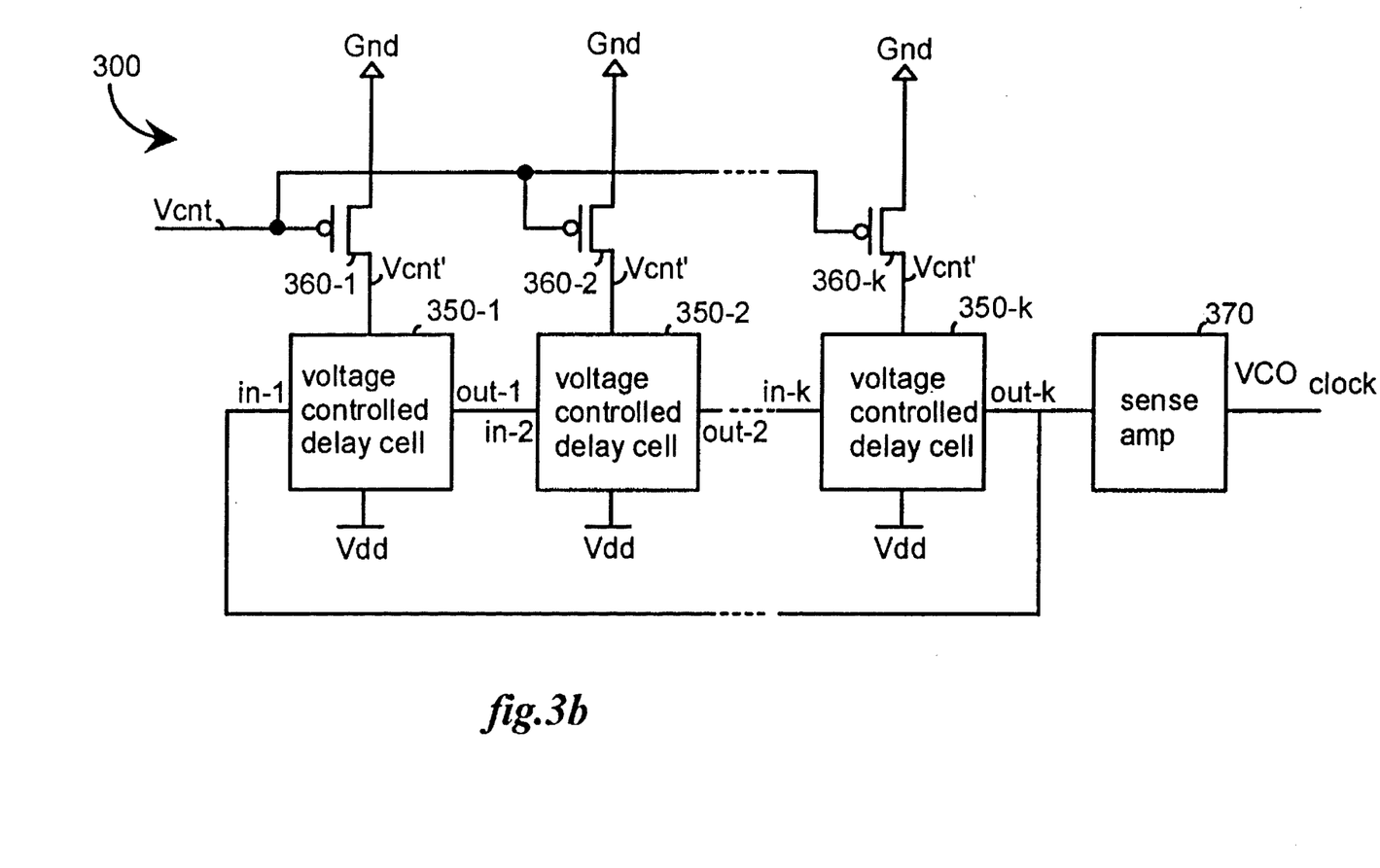
FIG. 3b illustrates, as an example, a block diagram of an alternative VCO useful for the PLL of FIG. 2.

FIG. 3b illustrates, as an example, a block diagram of a VCO 300, suitable for replacing the VCO 200 in the PLL 100 of FIG. 2. Like the VCO 200, the VCO 300 also includes an odd number of a plurality of voltage controlled inverting delay cells, 350-1 to 350-k, connected together to form a k-stage ring oscillator. Unlike the VCO 200, however, the VCO 300 includes a plurality of p-mos transistors, 360-1 to 360-k, operating in saturated conducting states and acting as source-followers to provide an input voltage Vcnt' to each of the plurality of voltage controlled inverting delay cells, 350-1 to 350-k, while isolating the plurality of voltage controlled inverting delay cells, 350-1 to 350-k, from power supply noise. The drains of the plurality of p-mos transistors, 360-1 to 360-k, are each connected to a low voltage end Gnd of a power supply, the gates of the plurality of p-mos transistors, 360-1 to 360-k, are each connected to the control voltage Vcnt, and the sources of the plurality of p-mos transistors, 360-1 to 360-k, are each connected to a corresponding one of the plurality of voltage controlled inverting delay cells, 350-1 to 350-k. The k-stage ring oscillator of the VCO 300 is formed in a similar manner as the k-stage ring oscillator of the VCO 200.

Figure 3C:
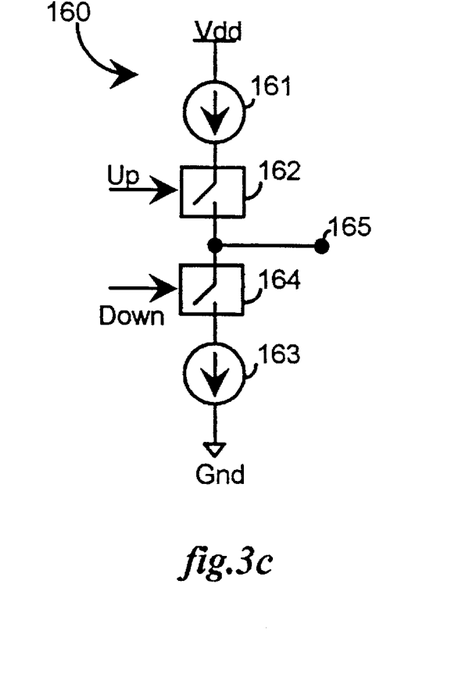
FIGS. 3c–3e respectively illustrate, as examples, circuit schematics for a charge pump circuit useful for the PLL of FIG. 2, a loop filter circuit useful for the PLL of FIG. 2, and a voltage controlled inverting delay cell circuit useful for the VCO's of FIGS. 3a and 3b.
Figure 3D:
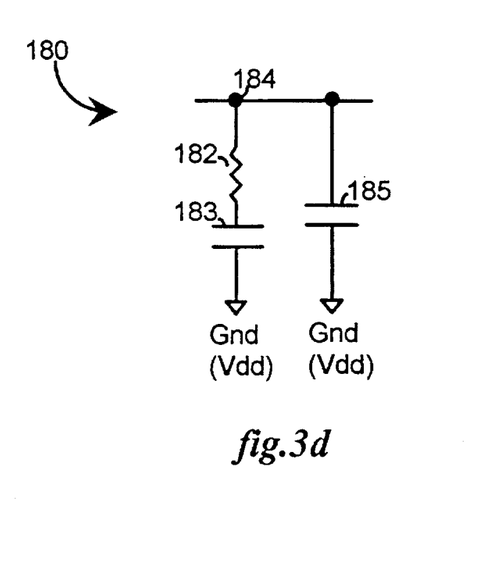

FIGS. 3c and 3d respectively illustrate, as examples, simplified circuits for the charge pump 160 and the loop filter 180 of the PLL 100. The charge pump circuit 160 includes matched current sources 161 and 163, and switches 162 and 164 respectively responsive to the up and down signals from the PFD 140. When the up signal is activated (and the down signal is deactivated), the switch 162 closes, thus charging up the voltage on node 165. On the other hand, when the down signal is activated (and the up signal is deactivated), the switch 164 closes, thus discharging the voltage on node 165. The loop filter 180 preferably includes a series connected resistor 182 and capacitor 183 which are in turn, connected in parallel with a second capacitor 185 to form a second-order filter. Node 184 of the loop filter 180 is connected to node 165 of the charge pump 160 to provide the control voltage Vcnt. When providing the control voltage Vcnt to the gate of a n-mos transistor source-follower such as included in the VCO 200 of FIG. 3a, the capacitors 183 and 185 are preferably connected to the low voltage reference Gnd (as indicated without parentheses), and when providing the control voltage Vcnt to the gate of a p-mos transistor source-follower such as included in the VCO 300 of FIG. 3b, the capacitors 183 and 185 are preferably connected to the high voltage reference Vdd (as indicated within parentheses). The respective values for the resistor 182, capacitor 183 and capacitor 185 are selected to ensure stability of the PLL 100. This may be done through conventional simulation or prototyping techniques.

Figure 3E:
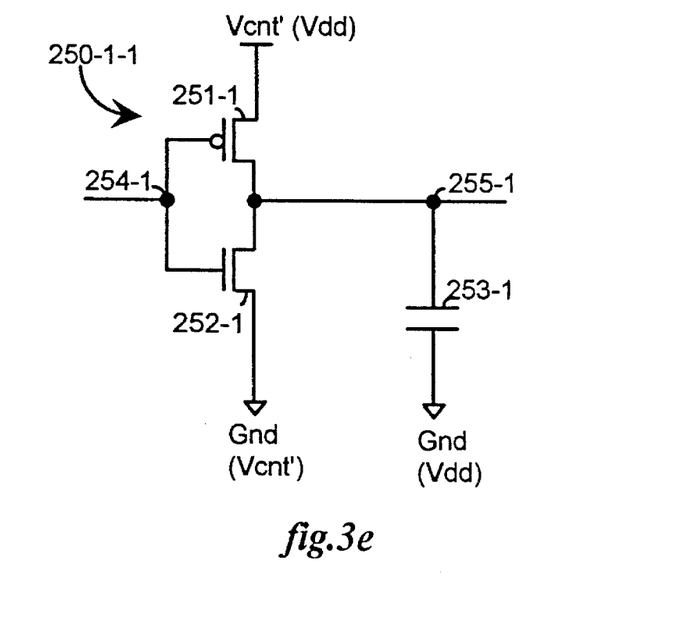

FIG. 3e illustrates, as an example, a voltage controlled inverting delay cell 250-1-1 useful for the VCO 200 of FIG. 3a when connected between the input voltage Vcnt' and the low reference voltage Gnd (as indicated without parentheses), and useful for the VCO 300 of FIG. 3b when connected between the high reference voltage Vdd and the input voltage Vcnt' (as indicated within parentheses). The voltage controlled inverting delay cell 250-1-1 includes a p-mos transistor 251-1 and a n-mos transistor 252-1, wherein the source of p-mos transistor 251-1 is connected to the input voltage Vcnt' for the VCO 200 of FIG. 3a and to the high reference voltage Vdd for the VCO 300 of FIG. 3b, the source of the n-mos transistor 252-1 is connected to the low voltage reference Gnd for the VCO 200 of FIG. 3a and to the input voltage Vcnt' for the VCO 300 of FIG. 3b, the gates of p-mos and n-mos transistors 251-1 and 252-1 are connected together at node 254-1 to form an input in-1 of the voltage controlled inverting delay cell 250-1-1, and the drains of p-mos and n-mos transistors 251-1 and 252-1 are connected together at node 255-1 to form an output out-1 of the voltage controlled inverting delay cell 250-1-1. A capacitor 253-1 is also preferably included in the voltage controlled inverting delay cell 250-1-1 by connecting the capacitor 253-1 between node 255-1, and the low reference voltage Gnd (as indicated without parentheses) when the voltage controlled inverting delay cell 250-1-1 is used with the VCO 200 of FIG. 3a or the high reference voltage Vdd (as indicated within parentheses) when the voltage controlled inverting delay cell 250-1-1 is used with the VCO 300 of FIG. 3b.

Figure 4A:
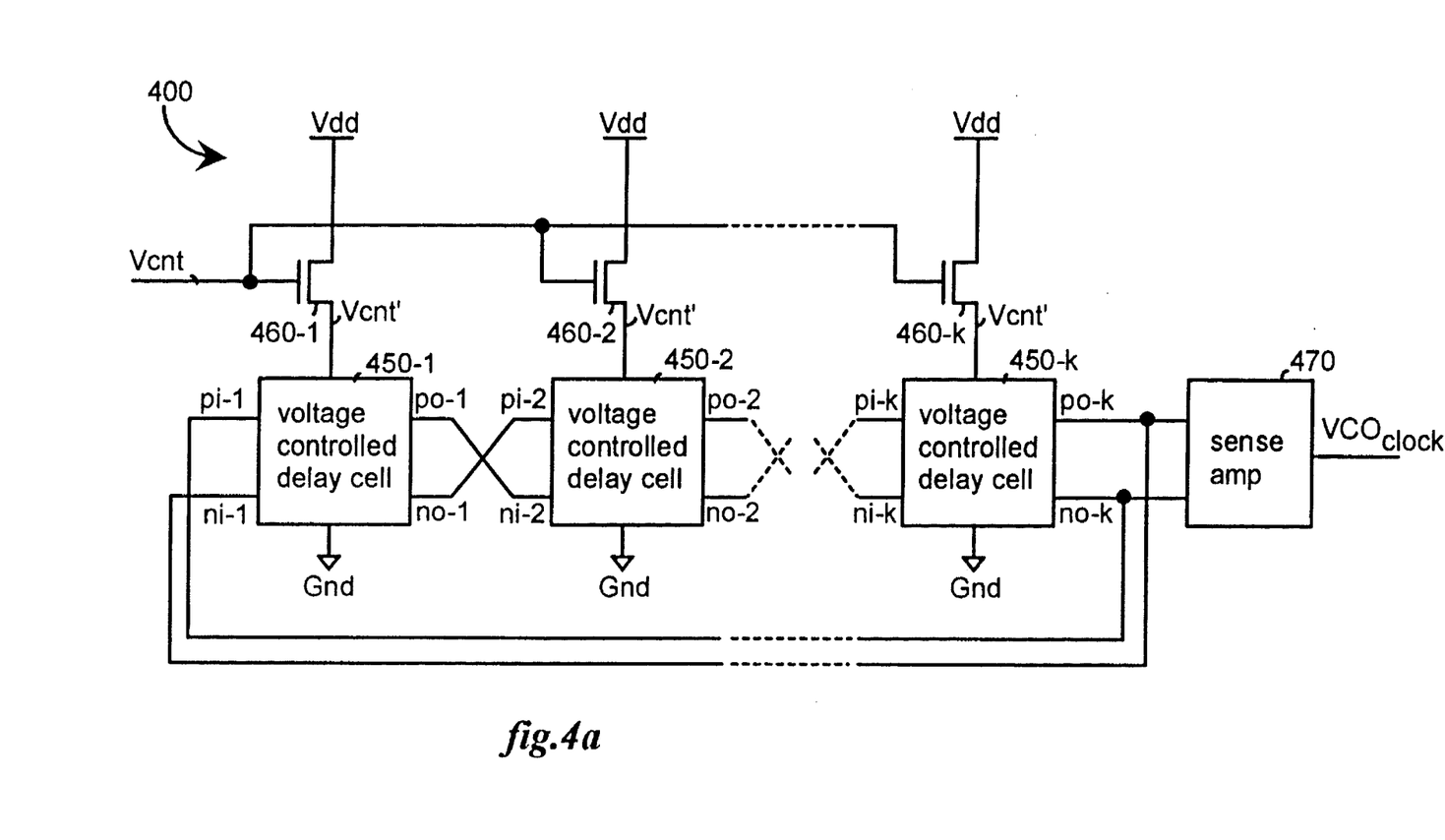
FIG. 4a illustrates, as an example, a block diagram of another alternative VCO useful for the PLL of FIG. 2.

FIG. 4a illustrates, as an example, a block diagram of a VCO 400, also suitable for substitution of the VCO 200 in the PLL 100 of FIG. 2. The VCO 400 includes a plurality of voltage controlled differential inverting delay cells, 450-1 to 450-k, connected together to form a k-stage ring oscillator, and a plurality of n-mos transistors, 460-1 to 460-k, operating in saturated conducting states and acting as source-followers to provide an input voltage Vcnt' to each of the plurality of voltage controlled differential inverting delay cells, 450-1 to 450-k, while isolating the plurality of voltage controlled differential inverting delay cells, 450-1 to 450-k, from power supply noise. The drains of the plurality of n-mos transistors, 460-1 to 460-k, are each connected to a high voltage end Vdd of a power supply, the gates of the plurality of n-mos transistors, 460-1 to 460-k, are each connected to the control voltage Vcnt, and the sources of the plurality of n-mos transistors, 460-1 to 460-k, are each connected to a corresponding one of the plurality of voltage controlled differential inverting delay cells, 450-1 to 450-k.

Each of the voltage controlled differential inverting delay cells, 450-1 to 450-k, has two inputs and two outputs. A first signal entering a first input designated a positive input pi-k for the kth voltage controlled delay cell 450-k causes an inverted signal to be generated at a first output designated a negative output no-k for the kth voltage controlled delay cell 450-k, after a delay determined by the magnitude of the input voltage Vcnt' provided to the kth voltage controlled delay cell 450-k. Similarly, a second signal (generally opposite in polarity to the first signal) entering a second input designated a negative input ni-k for the kth voltage controlled delay cell 450-k causes an inverted signal to be generated at a second output designated as a positive output po-k for the kth voltage controlled delay cell 450-k, after a delay substantially the same as the first signal's for a same magnitude of the control voltage Vcnt provided to the kth voltage controlled delay cell 450-k.

For an odd number of the plurality of voltage controlled differential inverting delay cells, 450-1 to 450-k, the k-stage ring oscillator is formed as shown in FIG. 4a by connecting a positive output of each one of the plurality of voltage controlled differential inverting delay cells, 450-1 to 450-k, to a negative input of another one of the plurality of voltage controlled differential inverting delay cells, 450-1 to 450-k, and a negative output of each one of the plurality of voltage controlled differential inverting delay cells, 450-1 to 450-k, to a positive input of another one of the plurality of voltage controlled differential inverting delay cells, 450-1 to 450-k, in such a fashion that the plurality of voltage controlled differential inverting delay cells, 450-1 to 450-k, form a ring structure as shown in FIG. 4a. For example, a positive output po-1 of a first voltage controlled differential inverting delay cell 450-1 is connected to a negative input ni-2 of a second voltage controlled differential inverting delay cell 450-2, and a negative output no-1 of the first voltage controlled differential inverting delay cell is connected to a positive input pi-2 of the second voltage controlled differential inverting delay cell 450-2, and so on, until a positive output po-k of a kth voltage controlled differential inverting delay cell 450-k is connected back to a negative input ni-1 of the first voltage controlled differential inverting delay cell 450-1, and a negative output no-k of the kth voltage controlled differential inverting delay cell 450-k is connected back to a positive input pi-1 of the first voltage controlled differential inverting delay cell 450-1. Thereupon, by varying the input voltage Vcnt' provided to each of the plurality of voltage controlled differential inverting delay cells, 450-1 to 450-k, respective time delays in generating a pair of output signals corresponding to the pair of signals entering each of the plurality of voltage controlled differential inverting delay cells, 450-1 to 450-k, are correspondingly varied, and as a result, the period of oscillation of the VCO 400 is correspondingly varied (as evidenced, for example, on a signal $VCO_{clock}$ sensed through a sense amplifier 470 generated at the positive and negative outputs, po-k and no-k, of the kth voltage controlled delay cell 450-k).

For an even number of the plurality of voltage controlled differential inverting delay cells, 450-1 to 450-k, the k-stage ring oscillator is formed slightly modified from the k-stage ring oscillator shown in FIG. 4a. In the connections between two of the voltage controlled differential inverting delay cells, 450-1 to 450-k, the connections are different than those between other twos of the voltage controlled differential inverting delay cells, 450-1 to 450-k. In the different connection, a positive output of one of the two voltage controlled differential inverting delay cells is connected to a positive input of the other of the two voltage controlled differential inverting delay cells, 450-1 to 450-k, and a negative output of the one of the two voltage controlled differential inverting delay cells, 450-1 to 450-k, is connected to a negative input of the other of the two voltage controlled differential inverting delay cells, 450-1 to 450-k. All other connections between the odd number of the plurality of voltage controlled differential inverting delay cells, 450-1 to 450-k, are made in the same manner as described in reference to the ring oscillator shown in FIG. 4a.

Figure 4B:
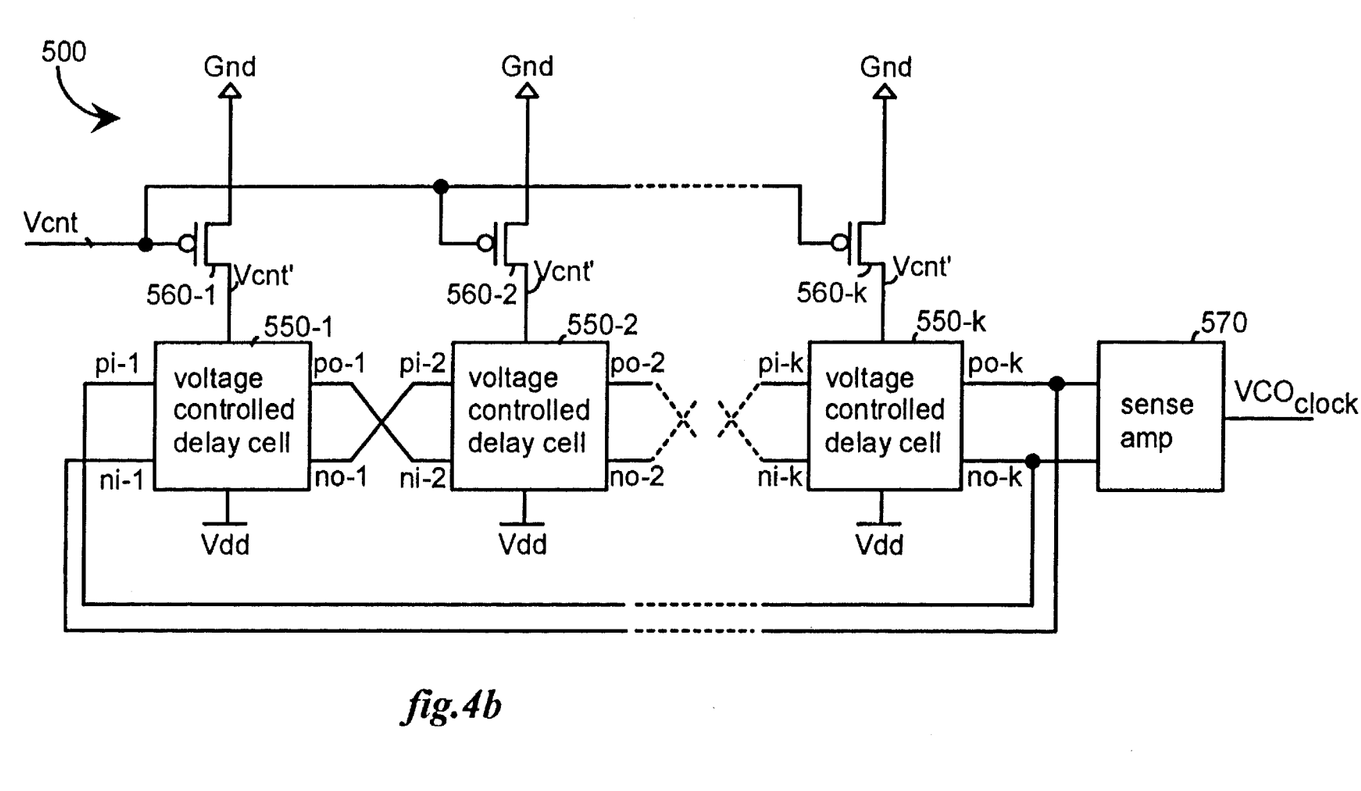
FIG. 4b illustrates, as an example, a block diagram of still another alternative VCO useful for the PLL of FIG. 2.

FIG. 4b illustrates, as an example, a block diagram of another VCO 500, also suitable for substitution of the VCO 200 in the PLL 100 of FIG. 2. The VCO 500 includes a plurality of voltage controlled differential inverting delay cells, 550-1 to 550-k, connected together to form a k-stage ring oscillator, and a plurality of p-mos transistors, 560-1 to 560-k, operating in saturated conducting states and acting as source-followers to provide an input voltage Vcnt' to each of the plurality of voltage controlled differential inverting delay cells, 550-1 to 550-k, while isolating the plurality of voltage controlled differential inverting delay cells, 550-1 to 550-k, from power supply noise. The drains of the plurality of p-mos transistors, 560-1 to 560-k, are each connected to a low voltage end Gnd of a power supply, the gates of the plurality of p-mos transistors, 560-1 to 560-k, are each connected to the control voltage Vcnt, and the sources of the plurality of p-mos transistors, 560-1 to 560-k, are each connected to a corresponding one of the plurality of voltage controlled differential inverting delay cells, 550-1 to 550-k.

Each of the voltage controlled differential inverting delay cells, 550-1 to 550-k, has two inputs and two outputs, and functions in a similar manner as described in reference to each of the voltage controlled differential inverting delay cells, 450-1 to 450-k of the VCO 400. In addition, the k-stage ring oscillator of the VCO 500 is also formed in a similar manner as described in reference to the k-stage ring oscillator of the VCO 400.

FIGS. 5a–5d respectively illustrate, as examples, voltage controlled differential inverting delay cells, 450-1-1 to 450-1-4, useful for the VCO 400 of FIG. 4a when connected between the input voltage Vcnt' and the low reference voltage Gnd (as indicated without parentheses), and useful for the VCO 500 of FIG. 4b when connected between the high reference voltage Vdd and the input voltage Vcnt' (as indicated within parentheses).

Figure 5A:
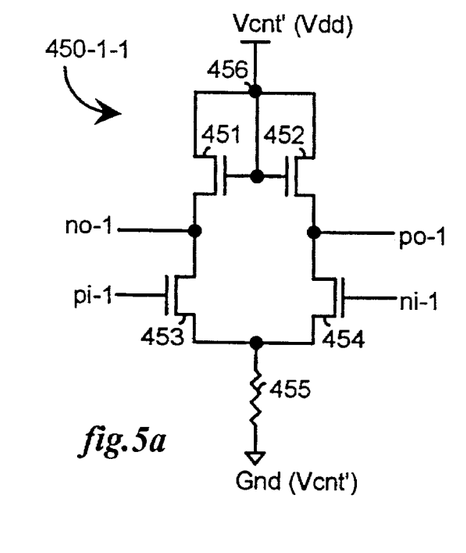
FIGS. 5a–5d illustrate, as examples, voltage controlled delay cell circuits useful for the VCO's of FIGS. 4a and 4b.

In FIG. 5a, a first voltage controlled differential inverting delay cell 450-1-1 useful for the VCO 400 of FIG. 4a, includes n-mos transistors 451 and 452 having drains connected at node 456 to the input voltage Vcnt', and gates connected together and to the input voltage Vcnt' so that they are always turned on; and n-mos transistors 453 and 454 having sources connected together and to a low reference voltage Gnd through a resistor 455, gates respectively acting as positive and negative inputs pi-1 and ni-1 of the voltage controlled differential inverting delay cell 450-1-1, and drains respectively connected to drains of the n-mos transistors 451 and 452 to form at such connections negative and positive outputs no-1 and po-1 of the voltage controlled differential inverting delay cell 450-1-1.

To modify the first voltage controlled differential inverting delay cell 450-1-1 to be useful for the VCO 500 of FIG. 4b, the drains of the n-mos transistors 451 and 452 would be connected at node 456 to a high reference voltage Vdd, and the sources of the n-mos transistors 453 and 454 would be connected together and to the input voltage Vcnt' through the resistor 455. All other connections between the n-mos transistors 451-454 would be the same as described in reference to the previously described voltage controlled differential inverting delay cell 450-1-1 useful for the VCO 400 of FIG. 4a.

Figure 5B:
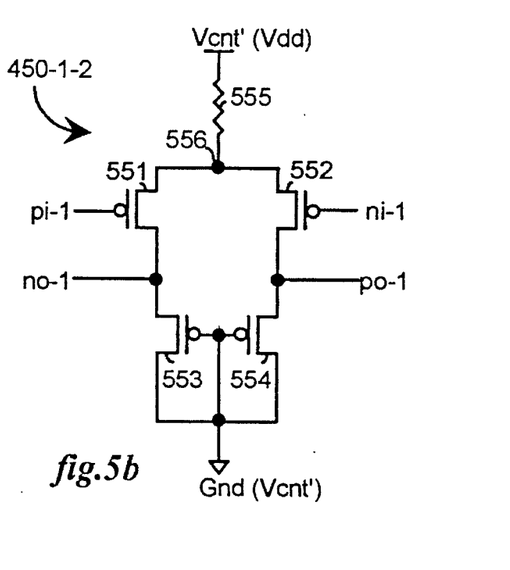

In FIG. 5b, a second voltage controlled differential inverting delay cell 450-1-2 useful for the VCO 400 of FIG. 4a, includes p-mos transistors 551 and 552 having sources connected at node 556 to the input voltage Vcnt' through a resistor 555, and gates respectively acting as positive and negative inputs pi-1 and ni-1 of the voltage controlled differential inverting delay cell 450-1-2; and p-mos transistors 553 and 554 having sources respectively connected to drains of the p-mos transistors 551 and 552 to form at such connections negative and positive outputs no-1 and po-1 of the voltage controlled differential inverting delay cell 450-1-2, drains connected together and to a low reference voltage Gnd, and gates connected together and to the low reference voltage Gnd such that they are always turned on.

To modify the second voltage controlled differential inverting delay cell 450-1-2 to be useful for the VCO 500 of FIG. 4b, the sources of the p-mos transistors 551 and 552 would be connected through resistor 555 to a high reference voltage Vdd, and the drains of the p-mos transistors 553 and 554 would be connected together and to the input voltage Vcnt'. All other connections between the p-mos transistors 551–554 would be the same as described in reference to the previously described voltage controlled differential inverting delay cell 450-1-2 useful for the VCO 400 of FIG. 4a.

Figure 5C:
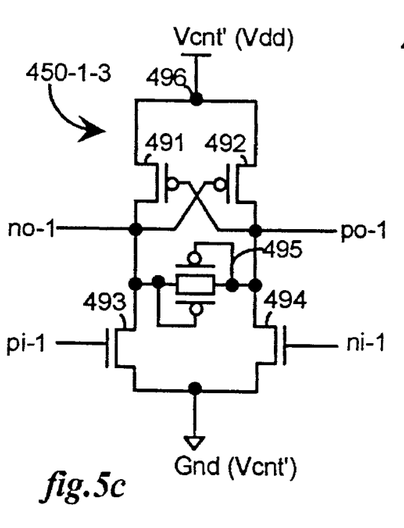

In FIG. 5c, a third voltage controlled differential inverting delay cell 450-1-3 useful for the VCO 400 of FIG. 4a, includes p-mos transistors 491 and 492 having sources connected at node 496 to the input voltage Vcnt', and gates wherein the gate of p-mos transistor 491 is connected to a drain of p-mos transistor 492 and the gate of p-mos transistor 492 is connected to a drain of p-mos transistor 491; and n-mos transistors 493 and 494 having sources connected to a low reference voltage Gnd, gates respectively acting as the positive and negative inputs pi-1 and ni-1 of the voltage controlled differential inverting delay cell 450-1-3, and drains respectively connected to the drains of the p-mos transistors 491 and 492 to form at such connections negative and positive outputs no-1 and po-1 of the voltage controlled differential inverting delay cell 450-1-3. A pair 495 of output clipping diodes is also preferably connected between the positive and negative outputs po-1 and no-1 of the voltage controlled delay cell 450-1-3.

To modify the third voltage controlled differential inverting delay cell 450-1-3 to be useful for the VCO 500 of FIG. 4b, the sources of the p-mos transistors 491 and 492 would be connected to a high reference voltage Vdd, and the sources of the n-mos transistors 493 and 494 would be connected together and to the input voltage Vcnt'. All other connections between the p-mos transistors 491 and 492, and the n-mos transistors 493 and 494 would be the same as described in reference to the previously described voltage controlled differential inverting delay cell 450-1-3 useful for the VCO 400 of FIG. 4a.

Figure 5D:
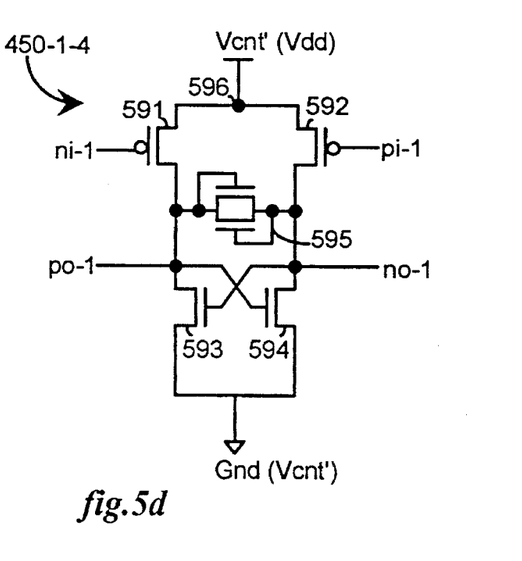

In FIG. 5d, a fourth voltage controlled differential inverting delay cell 450-1-4 useful for the VCO 400 of FIG. 4a, includes p-mos transistors 591 and 592 having sources connected at node 596 to the input voltage Vcnt', and gates respectively acting as the negative and positive inputs ni-1 and pi-1 of the voltage controlled differential inverting delay cell 450-1-4; and n-mos transistors 593 and 594 having sources connected to a low reference voltage Gnd, gates wherein the gate of n-mos transistor 593 is connected to a drain of n-mos transistor 594 and the gate of n-mos transistor 594 is connected to a drain of n-mos transistor 593, and drains respectively connected to the drains of the p-mos transistors 591 and 592 and to form at such connections positive and negative outputs po-1 and no-1 of the voltage controlled differential inverting delay cell 450-1-4. A pair 595 of output clipping diodes is also preferably connected between the positive and negative outputs po-1 and no-1 of the voltage controlled delay cell 450-1-4.

To modify the fourth voltage controlled differential inverting delay cell 450-1-4 to be useful for the VCO 500 of FIG. 4b, the sources of the p-mos transistors 591 and 592 would be connected to a high reference voltage Vdd, and the sources of the n-mos transistors 593 and 594 would be connected together and to the input voltage Vcnt'. All other connections between the p-mos transistors 591 and 592, and the n-mos transistors 593 and 594 would be the same as described in reference to the previously described voltage controlled differential inverting delay cell 450-1-4 useful for the VCO 400 of FIG. 4a.

Figure 6:
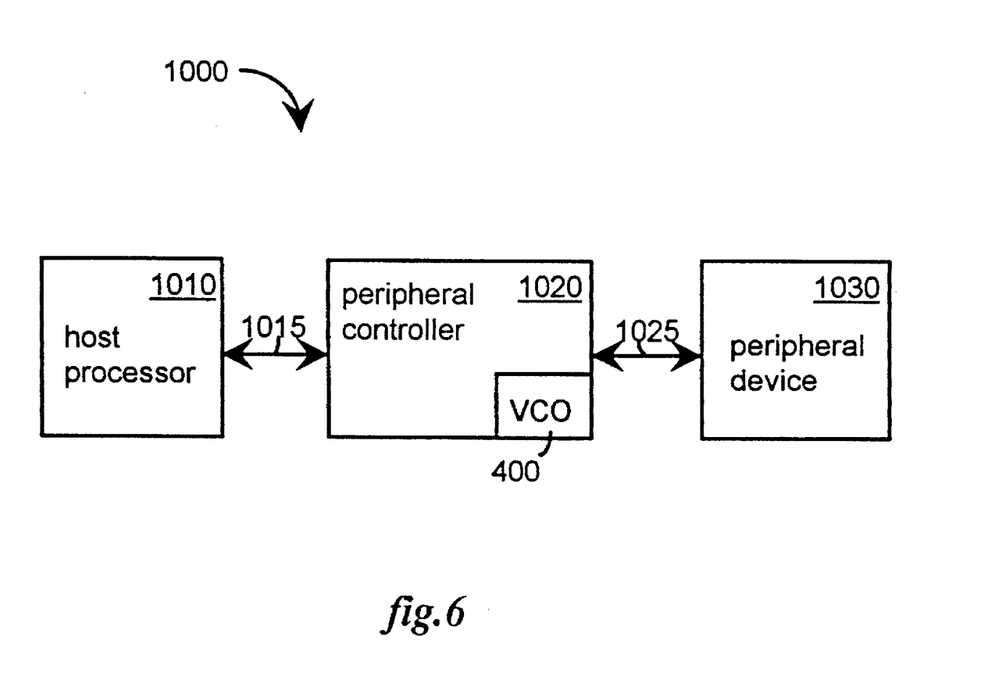
FIG. 6 illustrates, as an example, a block diagram of a computer system having a peripheral controller including a VCO utilizing aspects of the present invention.

FIG. 6 illustrates, as an example, a block diagram of a computer system 1000 including a host processor 1010, a peripheral controller 1020, and a peripheral device 1030. The host processor 1010 is preferably one of a number of commercially available microprocessors such as those marketed by Intel and Motorola. The peripheral device may be any one of a number of devices such as a disk drive, a CRT monitor, a modem, or the like. The peripheral controller 1020 interfaces between the host processor 1010 and the peripheral device 1030 to free up the host processor 1010 from having to perform certain peripheral device control functions. For example, the peripheral controller 1020 may be a disk drive controller for controlling a disk drive, a graphics controller for controlling a CRT monitor, or a modem controller for controlling a modem. As part of the peripheral controller 1020, a voltage controlled oscillator such as VCO 200, VCO 300, VCO 400, or VCO 500 is employed for a number of reasons. For examples, a voltage controlled oscillator may be included in a PLL (not shown) performing any one of a number of functions such as clock signal synthesis, clock signal aligning, or clock signal recovery.

Although the various aspects of the present invention have been described with respect to a preferred embodiment, it will be understood that the invention is entitled to full protection within the full scope of the appended claims.

What is claimed is:

1. A voltage controlled delay circuit with power supply noise isolation, comprising:

delay means responsive to an input voltage for varying the delay of a signal propagating through said delay means, and a transistor having a drain connected to a power supply, a gate connected to a control voltage, and a source providing said input voltage to said delay means such that said input voltage follows said control voltage and is isolated from noise on said power supply connection to said transistor.

2. The voltage controlled delay circuit as recited in claim 1, wherein said transistor comprises an n-mos transistor having a drain connected to a high voltage end of said power supply, a gate connected to said control voltage, and a source providing said input voltage to said delay means such that said input voltage follows said control voltage and is isolated from noise on said power supply connection to said n-mos transistor.

3. The voltage controlled delay circuit as recited in claim 1, wherein said transistor comprises a p-mos transistor having a drain connected to a low voltage end of said power supply, a gate connected to said control voltage, and a source providing said input voltage to said delay means such that said input voltage follows said control voltage and is isolated from noise on said power supply connection to said p-mos transistor.

4. The voltage controlled delay circuit as recited in claim 1, wherein said delay means comprises:

a p-mos transistor having a source, a drain, and a gate, said p-mos transistor source connected to said input voltage, a capacitor having first and second ends, said second end connected to a low reference voltage, and an n-mos transistor having a source connected to said low reference voltage, a drain connected at an output node to said p-mos transistor drain and to said first end of said capacitor, and a gate connected at an input node to said p-mos transistor gate, such that varying said input voltage varies the delay of a signal propagating from said input node to said output node.

5. A voltage controlled delay circuit with power supply noise isolation, comprising:

delay means responsive to an input voltage for varying the delay of a pair of signals propagating through said delay means, and a transistor having a drain connected to a power supply, a gate connected to a control voltage, and a source providing said input voltage to said delay means such that said input voltage follows said control voltage and is isolated from noise on said power supply connection to said transistor.

6. The voltage controlled delay circuit as recited in claim 5, wherein said transistor comprises a first n-mos transistor having a drain connected to a high voltage end of said power supply, a gate connected to said control voltage, and a source providing said input voltage to said delay means such that said input voltage follows said control voltage and is isolated from noise on said power supply connection to said first n-mos transistor.

7. The voltage controlled delay circuit as recited in claim 6, said delay means receiving first and second of said pair of signals respectively at first and second inputs of said delay means, and providing delayed versions of said first and second of said pair of signals respectively at second and first outputs of said delay means, wherein said delay means comprises:

second and third n-mos transistors individually having a source, a drain, and a gate, said second and third n-mos transistor sources connected together and to said input voltage, said second and third n-mos transistor gates connected together and to said input voltage, and fourth and fifth n-mos transistors individually having a source, a drain, and a gate, said fourth and fifth n-mos transistor sources connected together and to a low reference voltage, said fourth n-mos transistor drain connected to said second n-mos transistor drain to form said first output of said delay means, said fifth n-mos transistor drain connected to said third n-mos transistor drain to form said second output of said delay means, and said fourth and fifth n-mos transistor gates respectively acting as said first and second inputs of said delay means.

8. The voltage controlled delay circuit as recited in claim 6, said delay means receiving first and second of said pair of signals respectively at first and second inputs of said delay means, and providing delayed versions of said first and second of said pair of signals respectively at second and first outputs of said delay means, wherein said delay means comprises:

first and second p-mos transistors individually having a source, a drain, and a gate, said first and second p-mos transistor sources connected together and to said input voltage, said first p-mos transistor gate connected to said second p-mos transistor drain, and said second p-mos transistor gate connected to said first p-mos transistor drain, and second and third n-mos transistors individually having a source, a drain, and a gate, said second and third n-mos transistor sources connected together and to a low reference voltage, said second n-mos transistor drain connected to said first p-mos transistor drain to form said first output of said delay means, said third n-mos transistor drain connected to said second p-mos transistor drain to form said second output of said delay means, and said second and third n-mos transistor gates respectively acting as said first and second inputs of said delay means.

9. The voltage controlled delay circuit as recited in claim 8 further comprising a pair of clipping diodes connected between said first and second outputs of said delay means.

10. The voltage controlled delay circuit as recited in claim 5, wherein said transistor comprises a first p-mos transistor having a drain connected to a low voltage end of said power supply, a gate connected to said control voltage, and a source providing said input voltage to said delay means such that said input voltage follows said control voltage and is isolated from noise on said power supply connection to said first p-mos transistor.

11. The voltage controlled delay circuit as recited in claim 10, said delay means receiving first and second of said pair of signals respectively at first and second inputs of said delay means, and providing delayed versions of said first and second of said pair of signals respectively at second and first outputs of said delay means, wherein said delay means comprises:

second and third p-mos transistors individually having a source, a drain, and a gate, said second and third p-mos transistor sources connected together and to a high reference voltage, and said second and third p-mos transistor gates respectively acting as said first and second inputs of said delay means, and fourth and fifth p-mos transistors individually having a source, a drain, and a gate, said fourth and fifth p-mos transistor sources connected together and to said input voltage, said fourth and fifth p-mos transistor gates connected together and to said input voltage, said fourth p-mos transistor drain connected to said second p-mos transistor drain to form said first output of said delay means, and said fifth p-mos transistor drain connected to said third p-mos transistor drain to form said second output of said delay means.

12. The voltage controlled delay circuit as recited in claim 10, said delay means receiving first and second of said pair of signals respectively at first and second inputs of said delay means, and providing delayed versions of said first and second of said pair of signals respectively at second and first outputs of said delay means, wherein said delay means comprises:

second and third p-mos transistors individually having a source, a drain, and a gate, said second and third p-mos transistor sources connected together and to a high reference voltage, and said second and third p-mos transistor gates respectively acting as said second and third inputs of said delay means, and first and second n-mos transistors individually having a source, a drain, and a gate, said first and second n-mos transistor sources connected together and to said input voltage, said first n-mos transistor gate connected to said second n-mos transistor drain and said third p-mos transistor drain to form said second output of said delay means, said second n-mos transistor gate connected to said first n-mos transistor drain and said second p-mos transistor drain to form said first output of said delay means.

13. The voltage controlled delay circuit as recited in claim 12 further comprising a pair of clipping diodes connected between said first and second outputs of said delay means.

14. In a voltage controlled oscillator, a ring oscillator comprising:

a plurality of delay means responsive to an input voltage for varying the delay of a signal propagating through said delay means, and at least one transistor having a drain connected to a power supply, a gate connected to a control voltage, and a source providing said input voltage to said plurality of delay means such that said input voltage follows said control voltage and is isolated from noise on said power supply connection to said transistor.

15. The voltage controlled oscillator as recited in claim 14, wherein said at least one transistor comprises an n-mos transistor having a drain connected to a high voltage end of a power supply, a gate connected to said control voltage, and a source providing said input voltage to said plurality of delay means such that said input voltage follows said control voltage and is isolated from noise on said power supply connection to said n-mos transistor.

16. The voltage controlled oscillator as recited in claim 14, wherein said at least one transistor comprises a p-mos transistor having a drain connected to a low voltage end of a power supply, a gate connected to said control voltage, and a source providing said input voltage to said plurality of delay means such that said input voltage follows said control voltage and is isolated from noise on said power supply connection to said p-mos transistor.

17. In a voltage controlled oscillator, a plurality of voltage controlled delay circuits forming a ring oscillator, wherein at least one of said plurality of voltage controlled delay circuits comprises:

delay means responsive to an input voltage for varying the delay of a pair of signals propagating through said delay means, and a transistor having a drain connected to a power supply, a gate connected to a control voltage, and a source providing said input voltage to said delay means such that said input voltage follows said control voltage and is isolated from noise on said power supply connection to said transistor.

18. The voltage controlled oscillator as recited in claim 17, wherein individual ones of said plurality of voltage controlled delay circuits comprises:

delay means responsive to an input voltage for varying the delay of a pair of signals propagating through said delay means, and a transistor having a drain connected to a power supply, a gate connected to a control voltage, and a source providing said input voltage to said delay means such that said input voltage follows said control voltage and is isolated from noise on said power supply connection to said transistor.

19. A voltage controlled oscillator with power supply noise isolation comprising a plurality of pairs individually including a transistor and a voltage controlled delay cell, wherein individual ones of said transistors have a gate connected to a control voltage, a drain connected to a power supply, and a source connected to a voltage controlled delay cell paired to said individual one transistor for providing an input voltage to said voltage controlled delay cell such that said input voltage follows said control voltage and is isolated from noise on said power supply connection to said individual one transistor.

20. The voltage controlled oscillator as recited in claim 19, wherein said voltage controlled delay circuits form a ring oscillator circuit.

21. A computer system comprising:

a host processor; and a peripheral controller including a voltage controlled oscillator having at least one voltage controlled delay circuit with power supply noise isolation, wherein individual ones of said at least one voltage controlled delay circuit comprises a delay means responsive to an input voltage for varying the delay of a signal propagating through said delay means, and a transistor having a drain connected to a power supply, a gate connected to a control voltage, and a source providing said input voltage to said delay means such that said input voltage follows said control voltage and is isolated from noise on said power supply connection to said transistor.

22. The computer system as recited in claim 21, wherein said transistor comprises an n-mos transistor having a drain connected to a high voltage end of said power supply, a gate connected to said control voltage, and a source providing said input voltage to said delay means such that said input voltage follows said control voltage and is isolated from noise on said power supply connection to said n-mos transistor.

23. The computer system as recited in claim 21, wherein said transistor comprises a p-mos transistor having a drain connected to a low voltage end of said power supply, a gate connected to said control voltage, and a source providing said input voltage to said delay means such that said input voltage follows said control voltage and is isolated from noise on said power supply connection to said p-mos transistor.

* * * * *